United States Patent
Inada et al.

(10) Patent No.: US 9,194,545 B2
(45) Date of Patent: Nov. 24, 2015

(54) LIGHT EMITTING DEVICE AND LIGHT SHEET

(75) Inventors: Yasuhisa Inada, Osaka (JP); Seiji Nishiwaki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/342,448

(22) PCT Filed: Sep. 3, 2012

(86) PCT No.: PCT/JP2012/005563
§ 371 (c)(1),
(2), (4) Date: Mar. 3, 2014

(87) PCT Pub. No.: WO2013/035299
PCT Pub. Date: Mar. 14, 2013

(65) Prior Publication Data
US 2014/0203700 A1 Jul. 24, 2014

(30) Foreign Application Priority Data
Sep. 7, 2011 (JP) ................................. 2011-194872

(51) Int. Cl.
| | |
|---|---|
| *H05B 33/02* | (2006.01) |
| *H01L 51/50* | (2006.01) |
| *F21K 99/00* | (2010.01) |
| *G02B 5/02* | (2006.01) |
| *H01L 51/52* | (2006.01) |

(52) U.S. Cl.
CPC ............... *F21K 9/50* (2013.01); *G02B 5/0252* (2013.01); *G02B 5/0278* (2013.01); *H01L 51/5268* (2013.01)

(58) Field of Classification Search
CPC ...... F21K 9/50; G02B 5/0252; G02B 5/0278; H01L 51/5268
USPC .......................................................... 313/506
See application file for complete search history.

(56) References Cited

U.S. PATENT DOCUMENTS

| | | | |
|---|---|---|---|
| 8,643,259 B2 * | 2/2014 | Inoue et al. ................ | 313/116 |
| 2002/0180348 A1 | 12/2002 | Oda et al. | |

(Continued)

FOREIGN PATENT DOCUMENTS

| | | |
|---|---|---|
| JP | 11-283751 A | 10/1999 |
| JP | 2003-115377 A | 4/2003 |

(Continued)

OTHER PUBLICATIONS

International Search Report for corresponding International Application No. PCT/JP2012/005563 mailed Nov. 6, 2012.

(Continued)

*Primary Examiner* — Sikha Roy
(74) *Attorney, Agent, or Firm* — Renner, Otto, Boisselle & Sklar, LLP

(57) ABSTRACT

A light-emitting device disclosed herein includes: an emission layer; a diffraction grating structure including a diffraction grating; and a diffusion layer having a structure for diffusing light which is transmitted from one face to another face. The light going out from the emission layer has a central wavelength λ. The diffraction grating has a period p which is not less than 1.0λ and not more than 3.5λ. The diffusion layer has a haze of 80% or more and a total light transmittance of 80% or less.

10 Claims, 12 Drawing Sheets

(56) References Cited

U.S. PATENT DOCUMENTS

| | | |
|---|---|---|
| 2003/0062520 A1 | 4/2003 | Toguchi et al. |
| 2004/0056592 A1* | 3/2004 | Noguchi ................. 313/512 |
| 2006/0062270 A1 | 3/2006 | Okutani et al. |
| 2009/0021153 A1* | 1/2009 | Lee et al. ............... 313/504 |
| 2010/0046236 A1 | 2/2010 | Nishiwaki |
| 2012/0056211 A1* | 3/2012 | Kitagawa et al. ........... 257/88 |
| 2012/0091447 A1 | 4/2012 | Yamamoto |

FOREIGN PATENT DOCUMENTS

| | | |
|---|---|---|
| JP | 2007-251096 A | 9/2007 |
| JP | 2009-004275 A | 1/2009 |
| JP | 2009-217292 A | 9/2009 |
| JP | 2011-099972 A | 5/2011 |
| WO | WO 2005/017860 A1 | 2/2005 |
| WO | WO 2010/101065 A1 | 9/2010 |
| WO | WO 2010/147230 A1 | 12/2010 |

OTHER PUBLICATIONS

Form PCT/IPEA/409 for corresponding International Application No. PCT/JP2012/005563 dated Jun. 27, 2013 and partial English translation.

Form PCT/IPEA/416 for corresponding International Application No. PCT/JP2012/005563 dated Jul. 9, 2013.

Notice of Reasons for Rejection for corresponding Japanese Patent Application No. 2013-532435 (with English translation) mailed on Sep. 16, 2014.

* cited by examiner (a)

(b)

(c)

(d)

(e)

(a)

(b)

(c)

(a)

(b)

(a)

(b)

LIGHT EMITTING DEVICE AND LIGHT SHEET

TECHNICAL FIELD

The present application relates to a sheet and a light-emitting device including the same.

BACKGROUND ART

In recent years, organic electro-luminescence (organic EL) devices are drawing attention as one kind of light-emitting device with a high emission efficiency. FIG. 1 schematically shows a cross-sectional structure of a generic organic EL device. The conventional organic EL device is structured so that an electrode 2, an emission layer 3, a transparent electrode 4, and a transparent substrate 5 are stacked on a substrate 1. The transparent substrate 5 is in contact with an air layer 6. By applying a voltage between the electrode 2 and the transparent electrode 4, the illuminant emits light at a point S in the interior of the emission layer 3. Within the generated light, a portion intactly propagates along the direction of the air layer 6, while a portion is reflected at the electrode 2 and then propagates along the direction of the air layer 6. When light propagates from a medium with a high-refractive index to a medium with a low-refractive index, total reflection occurs if the incident angle of the light exceeds a critical angle. As a result, only the light which has propagated without undergoing total reflection before reaching the air layer 6 goes out to the exterior of the organic EL device. Assuming refractive indices $n_k$, $n_0$ of the emission layer 3 and the air layer 6, respectively, the critical angle $\theta_c$ is expressed by eq. (1).

$$\theta_c = \sin^{-1}(n_0/n_k) \quad (1)$$

Therefore, in the organic EL device shown in FIG. 1, the light which can be extracted out of the device is limited to the light which is emitted at the point S and strikes the interface between the air layer 6 and the transparent substrate 5 at an angle smaller than the critical angle θc. Assuming that the light emission from the point S is isotropic, and that the transmittance at the refraction plane is 100% at any incident angle equal to or smaller than the critical angle, with the effect of interference of light being ignored, then the rate by which light can be extracted (light extraction efficiency) η is expressed as $1 - \cos\theta_c$. For example, when the emission layer 3 has a refractive index of 1.7, the extraction efficiency η is less than 20%. Thus, generally speaking, an organic EL device does not have a high efficiency of light utility.

In order to increase the light extraction efficiency, a technique is being studied which adjusts the thicknesses of the emission layer 3 and the transparent electrode 4 on the order of light wavelengths so that light is efficiently extracted by utilizing the effect of interference of light. However, since the effect of interference depends on the direction in which generated light propagates, light in every direction cannot be efficiently extracted. Therefore, this method cannot attain a 100% extraction efficiency. Moreover, since the interference of light depends on wavelength, it is difficult to efficiently extract light of all wavelengths within the emission wavelength region. In the case of a white-color organic EL device, this causes luminance unevenness or color unevenness, where luminance or color changes depending on the angle of viewing.

An example technique of more efficiency extracting light from an organic EL device as such is disclosed in Patent Document 1.

Patent Document 1 discloses an organic EL device having an improved light extraction efficiency, where a diffraction grating is formed on the substrate interface or the reflection surface in order to change the incident angle of light at or beyond which total reflection will occur, relative to the interface.

CITATION LIST

Patent Literature

[Patent Document 1] Japanese Laid-Open Patent Publication No. 11-283751

SUMMARY OF INVENTION

Technical Problem

However, in the organic EL device of Patent Document 1, the diffraction efficiency and diffraction angle when light passes through a diffraction grating structure depend on the wavelength and incident angle of light. Therefore, the intensity of light going out from the organic EL device varies with the angle of viewing (luminance unevenness). Moreover, when the illuminant generates white light, color variation occurs with the angle of viewing (color unevenness). Furthermore, even when the device is not emitting light, the organic EL device exhibits color variation depending on the angle of viewing because the light reflectance and angle of reflection of the diffraction grating structure depends on wavelength, thus deteriorating the appearance.

One non-limiting, and exemplary embodiment of the present application provides an optical sheet and light-emitting device which can reduce luminance unevenness and color unevenness and provide an improved light extraction efficiency.

Solution to Problem

A light-emitting device as one implementation of the present invention comprises: an emission layer; a diffraction grating structure including a diffraction grating; and a diffusion layer having a structure for diffusing light which is transmitted from one face to another face, wherein light going out from the emission layer has a central wavelength λ; the diffraction grating has a period p which is not less than 1.0λ and not more than 3.5λ; and the diffusion layer has a haze of 80% or more and a total light transmittance of 80% or less.

Advantageous Effects of Invention

A light-emitting device according to an implementation of the present invention includes a diffraction grating structure and a diffusion layer, whereby light extraction efficiency is improved and luminance unevenness and color unevenness can be effectively reduced.

DESCRIPTION OF EMBODIMENTS

Figure 1:
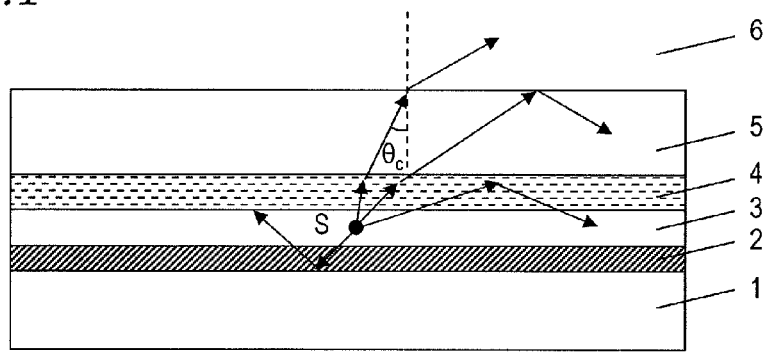
FIG. 1 A diagram showing the construction of a generic organic EL device and a manner of light propagation.

The outline of an implementation of the present invention is as follows.

A light-emitting device according to an implementation of the present invention comprises: an emission layer; a diffraction grating structure including a diffraction grating; and a diffusion layer having a structure for diffusing light which is transmitted from one face to another face, wherein light going out from the emission layer has a central wavelength $\lambda$; the diffraction grating has a period p which is not less than $1.0\lambda$, and not more than $3.5\lambda$; and the diffusion layer has a haze of 80% or more and a total light transmittance of 80% or less.

The diffraction grating structure may be located between the diffusion layer and the emission layer.

The diffusion layer may be in contact with air.

The light-emitting device may further comprise a protection layer, wherein the diffusion layer is located between the protection layer and the diffraction grating structure, and the protection layer may be in contact with air.

The light-emitting device may further comprise first and second electrodes which are in contact with the emission layer and sandwich the emission layer, wherein, the first electrode may be interposed between the diffusion layer and the emission layer, and transparent with respect to light going out from the emission layer; and the diffraction grating structure may be provided at an interface of the emission layer which is in contact with the first electrode.

The diffusion layer may be located between the diffraction grating structure and the emission layer.

The light-emitting device may further comprise first and second electrodes which are in contact with the emission layer and sandwich the emission layer, wherein, the first electrode may be interposed between the diffusion layer and the emission layer, and transparent with respect to light going out from the emission layer; and the second electrode may reflect light going out from the emission layer.

The emission layer may be located between the diffusion layer and the diffraction grating structure.

The light-emitting device may further comprise first and second electrodes which are in contact with the emission layer and sandwich the emission layer, wherein the first electrode may be interposed between the diffusion layer and the emission layer, and transparent with respect to light going out from the emission layer; and the diffraction grating structure may be provided at an interface of the emission layer which is in contact with the second electrode.

A sheet according to another implementation of the present invention comprises: a diffraction grating structure including a diffraction grating; and a diffusion layer having a structure for diffusing light which is transmitted from one face to another face, wherein light going out from the emission layer has a central wavelength $\lambda$; the diffraction grating has a period p which is not less than $1.0\lambda$, and not more than $3.5\lambda$; and the diffusion layer has a haze of 80% or more and a total light transmittance of 80% or less.

First Embodiment

Figure 2:
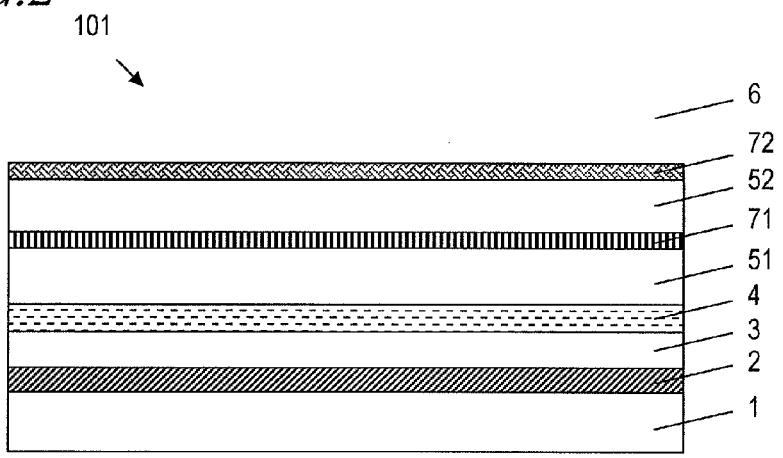
FIG. 2 A diagram schematically showing a cross-sectional structure of a light-emitting device according to a first embodiment.
Figure 3:
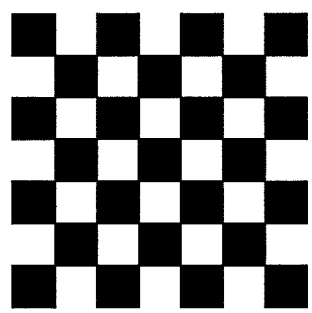
FIG. 3 (a) to (e) are diagrams schematically showing diffraction grating patterns.
Figure 3:
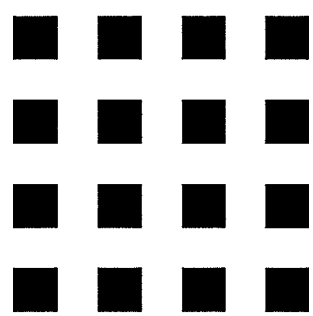
Figure 3:
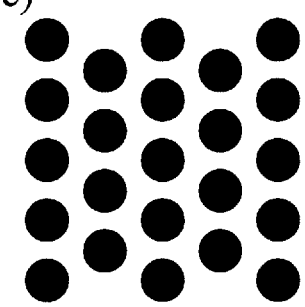
Figure 3:
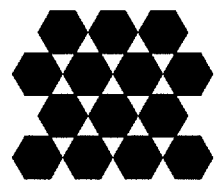
Figure 3:
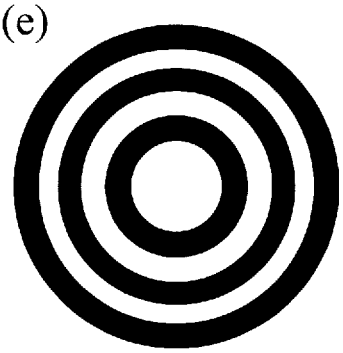

FIG. 2 schematically shows a cross-sectional structure of a first embodiment of the light-emitting device according to the present invention. The light-emitting device 101 includes an electrode 2 provided on a substrate an emission layer 3 located on the electrode 2, an electrode 4 located on the emission layer 3, a layer 51 located on the electrode 4, a diffraction grating structure 71 located on the layer 51, a layer 52 located on the diffraction grating structure 71, and a diffusion layer 72 located on the layer 52.

The present embodiment is effective for suppressing color unevenness, and therefore provides a particularly outstanding effect when using an emission layer 3 that emits white light. An example of a light-emitting device in which such an emission layer 3 is used may be a light-emitting device that incorporates an organic EL device, for example. In the case of organic EL, the emission layer 3 may sometimes be composed of plural layers in order to obtain a high emission efficiency; however, such plural layers will collectively be expressed as the emission layer 3 in the following description.

The electrode 2 and the electrode 4 may be in contact with the emission layer 3 and sandwich the emission layer 3, thus being electrically connected to the emission layer 3. The electrode 2 may be transparent with respect to the light going out from the emission layer 3. In the case where light is not to be extracted through the substrate 1, the electrode 2 may be opaque with respect to the light going out from the emission layer 3.

The substrate 1 supports the emission layer 3 interposed between the electrode 2 and the electrode 4. There is no particular limitation as to the material of the substrate 1, and any known support substrate may be used as the substrate 1, e.g., glass.

In the present embodiment, light going out from the emission layer 3 is transmitted through the diffraction grating structure 71, and after being further transmitted through the diffusion layer 72, goes out into an air layer 6 which is external to the light-emitting device 101. The layer 51 and the layer 52 are to be used as appropriate, for purposes such as adhesion of the two layers sandwiching each layer, protection, and planarity ensurement. The layer 51 and the layer 52 may be transparent with respect to the light going out from the emission layer 3. These layers may be omitted, and two or more each of the layer 51, 52 may be included. In other words, the present embodiment is applicable to any structure in which the diffraction grating structure 71 is located between the diffusion layer 72 and the emission layer 3 and in which light goes out from the diffusion layer 72 into the air layer 6.

In the present embodiment, the diffraction grating structure 71 has a sheet shape. The diffraction grating structure 71 is structured so that a two-dimensional diffraction grating is formed. FIGS. 3(a) to (e) show examples of two-dimensional diffraction grating arrangements. So long as a predetermined optical path-length difference is created between regions indicated as white and regions indicated as black in these figures, the diffraction grating structure 71 may be of various structures. For example, optical steps may be created based on a refractive index difference between materials, e.g., either one of the regions indicated as white and the regions indicated as black being air and the other being made of glass or the like, or, optical steps may be created based on different heights (thicknesses) while allowing both the regions indicated as white and the regions indicated as black to be made of the same optical material.

The diffusion layer 72 has a structure that diffuses light which is transmitted from one face to the other face via refraction, and known diffusers can be used.

Through combination of the diffraction grating structure 71 and the diffusion layer 72, the light-emitting device 101 of the present embodiment provides an effect which cannot be obtained with either one of them alone. Hereinafter, the optical characteristics of the diffraction grating structure 71 or the diffusion layer 72 alone will first be described, and the characteristics of the light-emitting device 101 will be described. Note that, within the light going out from the emission layer, any light that has undergone reflection or total reflection at an interface between different media is ignored in the calculation which was conducted in the below-described study; the calculation only deals with transmitted light.

1. Features of the Diffraction Grating Structure

Figure 4:
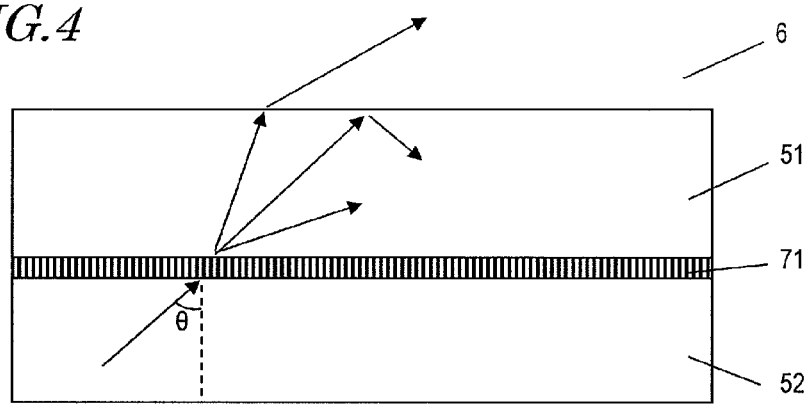
FIG. 4 A diagram showing a manner of light transmission through a diffraction grating structure.

A result of studying the characteristics of the diffraction grating disclosed in Patent Document 1 as the diffraction grating structure 71 will be described. As shown in FIG. 4, in a structure where a diffraction grating structure 71 having a diffraction grating with a period p is interposed between a layer 51 with a refractive index $n_{51}$ and a layer 52 with a refractive index $n_{52}$, a case will be considered where light is incident on the diffraction grating structure 71 from the layer 51 at an angle θ. In this case, $m^{th}$-order (where m is an integer) diffracted light occurs in the layer 52 in the direction of an angle $θ_m$ satisfying eq. (2).

$$n_{52} \sin θ_m - n_{51} \sin θ = mλ/p \qquad (2)$$

Through this diffraction, even light with an angle exceeding the critical angle in the layer 52 will become diffracted light with an angle equal to or smaller than the critical angle after passing through the diffraction grating, thus becoming able to go out into the air layer 6. Also in the case where the layer 51 is omitted so that the diffraction grating structure 71 is directly in contact with the air layer 6, if $θ_m$ has a solution in eq. (2) when $n_{52}=1$, extraction of light at or beyond the critical angle is possible for a similar reason.

Figure 5:
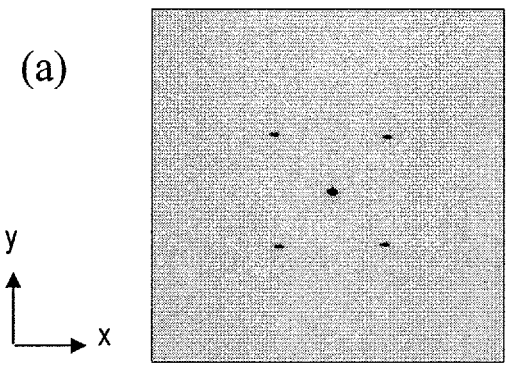
FIG. 5 (a) shows a light diffraction pattern by a diffraction grating structure; and (b) and (c) are schematic diagrams showing a cross-sectional structure and a planar structure of the diffraction grating structure.
Figure 5:
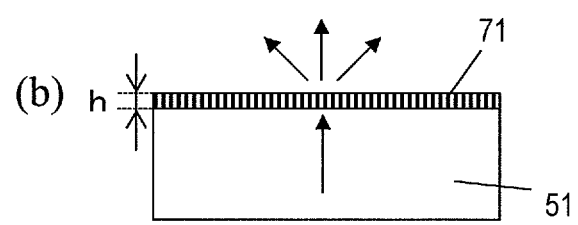
Figure 5:
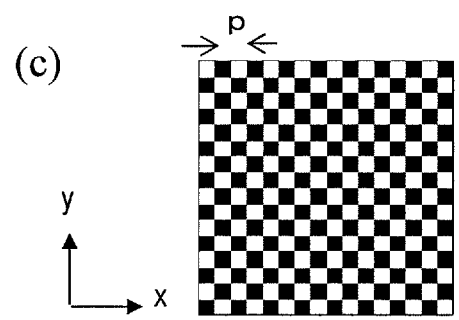

In order to examine the characteristics of the diffraction grating structure 71, an experiment was conducted to measure a radiation pattern of light which was perpendicularly incident on and transmitted through the diffraction grating structure 71. FIGS. 5(b) and (c) show cross-sectional and planar structures of the diffraction grating structure 71. The diffraction grating structure 71 has a diffraction grating which is formed in a two-dimensional manner in the xy directions. The lattice has a period p of 2.0 μm, and a thickness h of 0.6 μm. As shown in FIG. 5(c), the regions shown in black are made of glass, with a refractive index of 1.47. The regions indicated as white have a refractive index of 1.78. The incident laser light has a wavelength of λ=633 nm. FIG. 5(a) shows a radiation pattern of transmitted light. Since the diffraction grating structure 71 was composed of a rectangular lattice, four diffraction patterns were detected. From these diffraction patterns, it can be confirmed that light is diffracted in a direction $θ_m$ satisfying eq. (2).

2. Features of the Diffusion Layer

As described above, the diffusion layer 72 diffuses light which is transmitted from one face to the other face via refraction. Generally speaking, there are roughly two categories of known structures for diffusing light.

One is structures which mainly utilize a "refraction phenomenon" due to light passing through a structure which is sufficiently large relative to the light wavelength (e.g., having a size which is equal to or greater than five times the wavelength). Specifically, they may be prism structures, structures in which particles of about 10 μm are dispersed on/in the structure surface or interior, and so on.

The other is structures which mainly utilize a "diffraction phenomenon" due to light passing through a structure having a size which is on the order of the wavelength of light. Specifically, they may be diffraction gratings having a regular refractive index distribution with a period on the order of wavelength, minute random patterns on the order of wavelength (a structure disclosed in Japanese Laid-Open Patent Publication No. 2009-217292), and so on.

In the present embodiment and the following embodiments, the diffusion layer has the former structure, which utilizes the "refraction phenomenon" of light to diffuse light.

Figure 6:
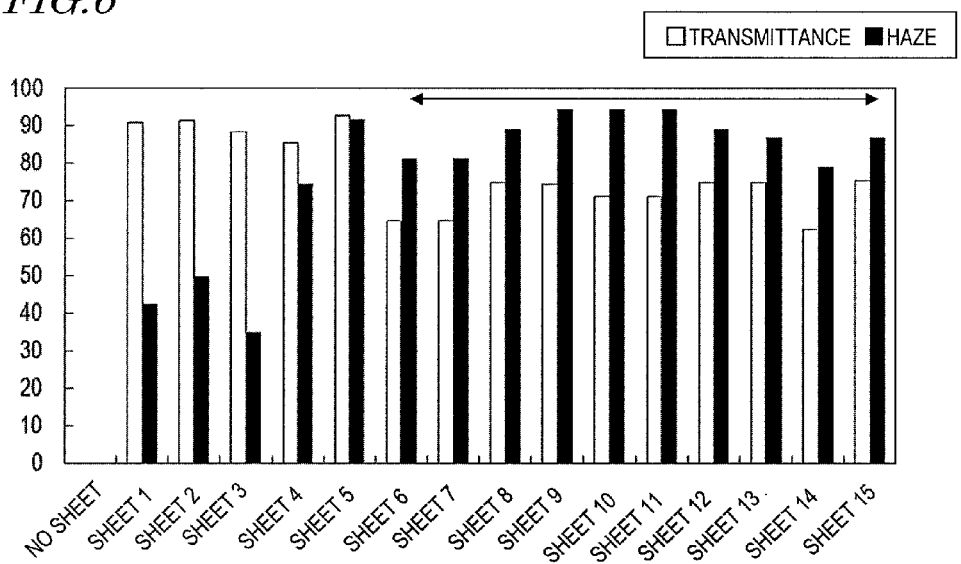
FIG. 6 A diagram showing transmittances and hazes of diffusion layers which were used in an experiment.

As the diffusion layer 72, for example, a diffusion sheet which is commercially available for applications such as a backlight of a liquid crystal display device can be used. The property of the diffusion layer 72 can be defined in terms of the total light transmittance (JIS K7361-1) when light is incident at the front, as well as the haze (JIS K7136, ISO 14782), which is an index of the degree of diffusion of light. FIG. 6 shows total light transmittances and haze values of various diffusion sheets having diffusion structure. Thus, there are diffusion sheets with various combinations of total light transmittances and haze values.

3. Characteristics of Light Extraction by the Diffraction Grating Structure 71 and the Diffusion Layer 72

Results of an experiment conducted on the characteristics of light extraction by the diffraction grating structure 71 and the diffusion layer 72 will be described. The diffraction grating structure 71 used in the experiment had a structure shown in FIGS. 5(b) and (c). One side of the square shape defining the unit of the diffraction grating was 0.6 μm, with a period p of 1.2 μm. Sheet 14 shown in FIG. 6 was used as the diffusion layer 72.

Figure 7:
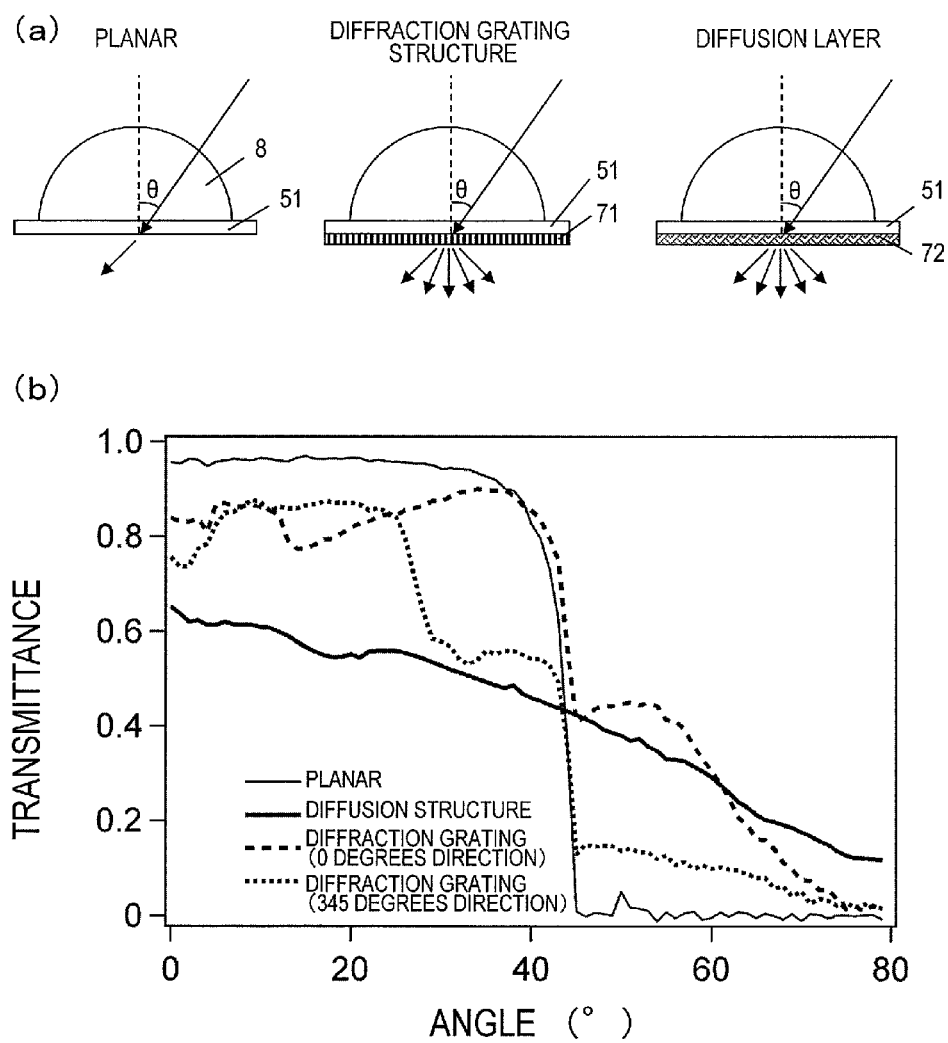
FIG. 7 Results of calculating angle dependences of transmittance of a diffraction grating structure and a diffusion layer, where (a) is a diagram showing structures used for the calculation, and (b) is a graph showing calculation results.

As shown in FIG. 7(*a*), a structure in which a semicolumnar prism 8 was attached on the layer 51 (hereinafter referred to as a planar structure), a structure in which a semicolumnar prism 8 was attached on the diffraction grating structure 71 via the layer 51 (diffraction grating structure), and a structure in which a semicolumnar prism 8 was attached on the diffusion layer 72 via the layer 51 (diffusion structure) were produced. Then, laser light having a wavelength of 633 nm was allowed to be incident on these structures, while varying the angle θ with respect to the vertical from 0 degrees to 80 degrees. As for the diffraction grating structure 71, the measurement was taken with respect to a plane (0 degrees direction) which is perpendicular to the y axis shown in FIG. 5(*c*) and a plane (45 degrees direction) which results from tilting this plane by 45 degrees in the y axis direction. FIG. 7(*b*) shows a graph in which transmittances of light transmitted through these structures are plotted against the incident angle.

It can be seen that the planar structure has a critical angle near 42 degrees, thus preventing light which is incident at any greater angle from being transmitted, but that even light at or beyond the critical angle is transmitted through the diffraction grating structure and the diffusion structure. It can be seen that the diffusion structure has its transmittance smoothly changing with angle, but that the diffraction grating has its transmittance changing drastically.

Figure 8:
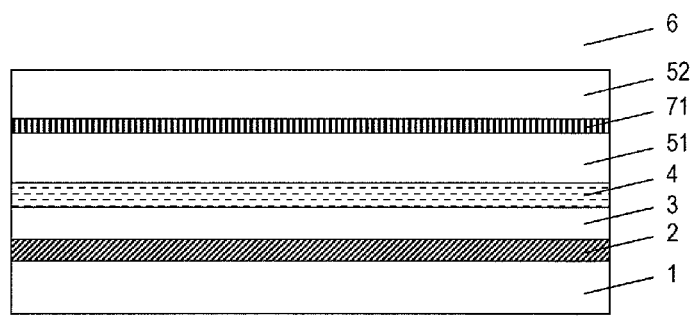
FIG. 8 Results of calculating intensity characteristics of a diffraction grating structure, where (a) shows the structure used for the calculation, and (b) is a graph showing calculation results.
Figure 8:
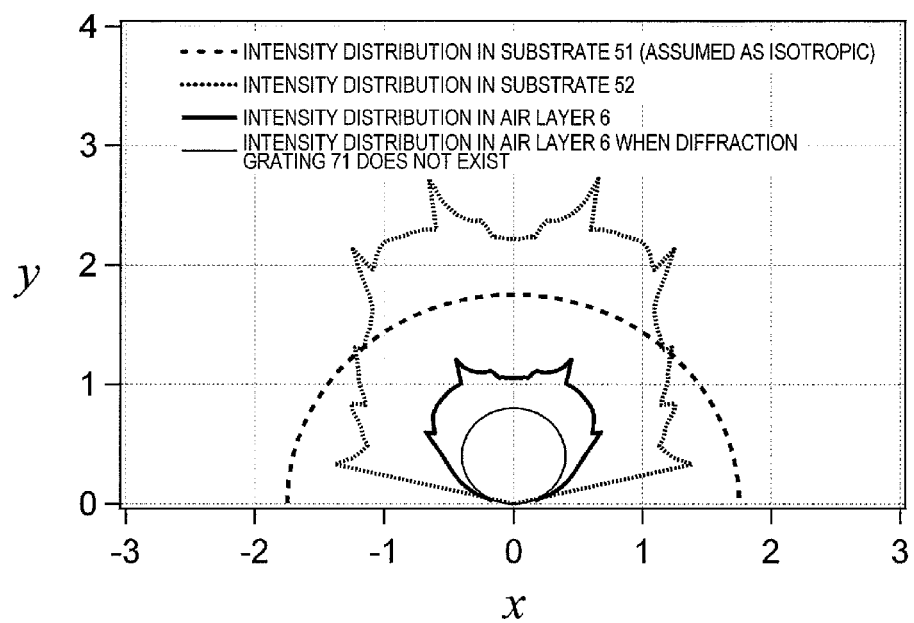

Next, results of calculation where a diffraction grating structure or a diffusion layer was used as a surface light source will be described. As shown in FIG. 8(*a*), an intensity distribution in a structure which was obtained by removing the diffusion layer 72 from the light-emitting device 101 of the present embodiment shown in FIG. 2 was calculated. The diffraction grating structure 71 has the structure described with reference to FIGS. 5(*b*) and (*c*), with a period p of 1 μm and a height h of 0.6 μm. Moreover, it was assumed that the layer 51 had an isotropic intensity distribution, i.e., the same intensity of light existed regardless of angle, this light having a wavelength of 565 nm.

FIG. 8(*b*) shows, in polar coordinates, an intensity distribution of light which passes through the diffraction grating structure 71 and the layer 52 and comes out into the air layer 6. From this result, it can be seen that the intensity of extracted light is greater when the diffraction grating structure 71 exists than when it does not exist. However, there is an angle at which the intensity becomes drastically stronger. This is indicative of a luminance unevenness, where luminance changes depending on the angle of viewing. Moreover, since the diffraction conditions in eq. (2) depend on wavelength, the position of this peak also depends on the wavelength of transmitted light. This means that color unevenness, where color changes depending on the angle, also occurs in the case where a white-color organic EL is used. Such characteristics emerge due to light diffraction as expressed by eq. (2). Therefore, similar characteristics are also exhibited when the diffraction grating structure 71 is placed so as to be directly in contact with the air layer.

Figure 9:
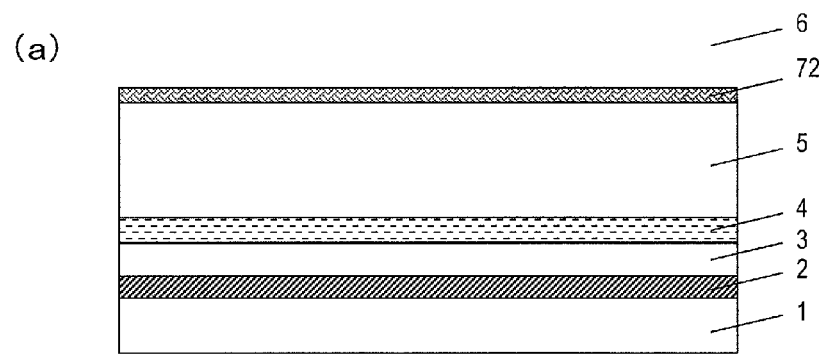
FIG. 9 Results of calculating intensity characteristics of a diffusion layer, where (a) shows the structure used for the calculation, and (b) is a graph showing calculation results.
Figure 9:
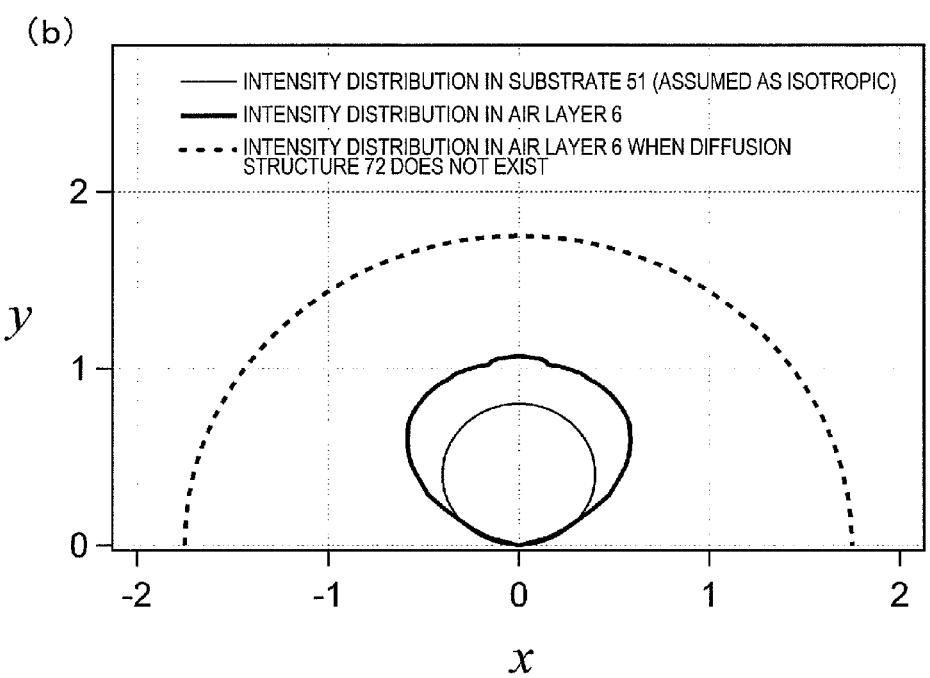

Next, results of calculation where a diffusion structure was used as a surface light source will be described. As shown in FIG. 9(*a*), an intensity distribution in a structure obtained by removing the diffraction grating structure 71 and the layer 52 from the light-emitting device 101 of the present embodiment shown in FIG. 2 was calculated. A diffusion layer 72 having a haze of 85% and a total light transmittance of 75% was used.

The other conditions were similar to the conditions for the intensity distribution measurement of the diffraction grating structure.

FIG. 9(*b*) shows, in polar coordinates, an intensity distribution of light which is transmitted through the diffusion layer 72 and comes out into the air layer 6. It can be seen that the intensity of extracted light is increased relative to the distribution of the case where the diffusion layer 72 does not exist. It can also be seen that, unlike when a diffraction grating is used, the curve representing the intensity distribution is smooth, indicative of absence of luminance unevenness. However, since the transmittance of the diffusion layer 72 is 75%, the overall transmit light amount is not much increased relative to that of the case where the diffusion layer 72 is not provided.

The above results indicate that, when the diffraction grating structure 71 is provided on a light-emitting device, the light amount of transmitted light increases, but color unevenness and luminance unevenness occur depending on the angle. On the other hand, when the diffusion layer 72 is provided on a light-emitting device, a uniform intensity distribution is obtained, but the overall transmit light amount is not greatly increased. In contrast, in accordance with the light-emitting device 101 of the present embodiment, the light extraction efficiency can be increased while ensuring an excellent intensity distribution.

Figure 10:
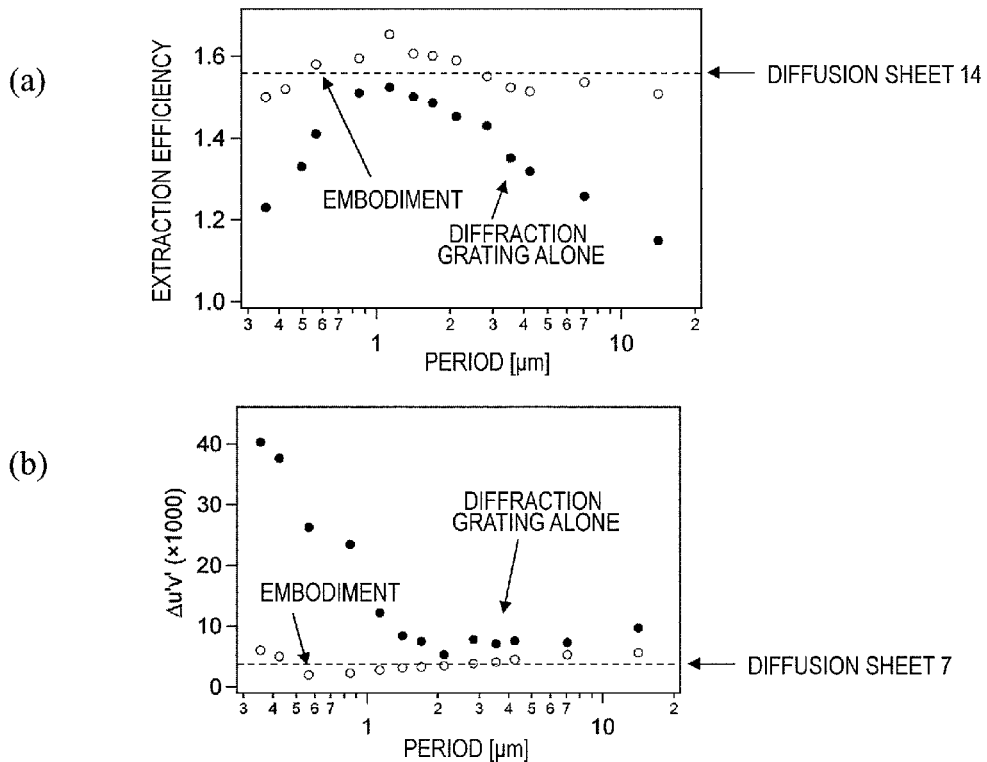
FIGS. 10 (a) and (b) are diagrams showing relationships between the period of a diffraction grating structure and light extraction efficiency and color difference, according to the first embodiment.

Hereinafter, the optical characteristics of the light-emitting device 101 of the present embodiment will be described with reference to experimental results. FIGS. 10(*a*) and (*b*) show relationships between the period of the diffraction grating structure 71 and light extraction efficiency and color difference, respectively, in the light-emitting device 101 of the present embodiment. As for color difference, (u',v') of the CIE colorimetric system was measured, and a maximum amount of change Δu'v' of (u'v') with respect to the viewing angle was plotted. In other words, as the value of Δu'v' increases, color undergoes greater change with the angle of viewing (there is greater color unevenness).

For comparison, measurement results of structures including the aforementioned diffusion layer 72 alone or the aforementioned diffraction grating structure 71 alone are also shown. The diffraction grating structure 71 had the structure shown in FIGS. 5(*b*) and (*c*). Moreover, sheet 14 (FIG. 10(*a*)) and sheet 7 (FIG. 10(*b*)) in FIG. 6 were used as the diffusion layer 72. Note that, among sheets 1 to 15, sheet 14 has the highest extraction efficiency as a sheet alone. Among sheets 1 to 15, sheet 7 has the smallest color difference Δu'v' as a sheet alone. The details will be described later.

The light going out from the emission layer 3 had a central wavelength of 565 nm. The central wavelength was defined so that a total intensity of light having any wavelength greater than this wavelength in the spectrum was equal to a total intensity of light having any wavelength smaller than this wavelength. As for extraction efficiency, values were plotted while defining the efficiency of an organic EL device not having an extraction structure as 1.

As shown in FIG. 10(*a*), with the light-emitting device 101 of the present embodiment, the light extraction efficiency was improved from that of any structure having a diffraction grating structure alone, in all diffraction grating periods from 0.3 μm to 12 μm for which measurements were taken. It can be seen that, particularly at periods in a range from 0.55 μm to 2 μm, extraction efficiencies are obtained which are greater than the highest extraction efficiency that is achievable by any structure having a diffraction grating structure alone or a diffusion sheet alone.

Moreover, as shown in FIG. 10(b), the color difference Δu'y' is greatly improved over that of any structure having a diffraction grating structure alone, particularly in a range of small diffraction grating periods. More specifically, the color difference Δu'v' is smaller than the structure having a diffraction grating structure alone across the entire range of periods from 0.3 μm to 12 μm. Furthermore, at diffraction grating periods from 0.55 μm to 2 μm, color differences are obtained which are smaller than the smallest color difference that is achievable by any structure having a diffraction grating structure alone or a diffusion sheet alone.

These results indicate that, in a light-emitting device having the diffusion layer 72 and the diffraction grating structure 71 like the light-emitting device 101 of the present embodiment, extraction efficiency and color difference are improved over those of any light-emitting device having a diffraction grating structure alone as the light-extracting structure, in all instances with diffraction grating periods from 0.3 μm to 12 μm. Moreover, at diffraction grating periods from 0.55 μm to 2 μm, light extraction efficiency and color difference are improved also over any light-emitting device having a diffusion sheet alone.

The above experiment was conducted with respect to a light-emitting device having a central wavelength of 565 nm. Under other different emission wavelengths, the same characteristics can be obtained by making proportional changes in the conditions for the diffraction grating period. In other words, given a central wavelength λ of the light going out from the emission layer 3, the diffraction grating period is preferably not less than 0.5(0.3/0.565)λ and not more than 21(12/0.565)λ, and more preferably not less than 1.0(0.55/0.565)λ and not more than 3.5(2/0.565)λ.

The diffraction efficiency of a diffraction grating is in proportion to the height and refractive index difference of the diffraction grating structure 71. Therefore, from the perspective of enhancing diffraction efficiency, it is preferable that the height and refractive index difference of the diffraction grating structure are as large as possible. On the other hand, the period pattern of a diffraction grating exerts its influence only along the azimuthal direction of diffracted light, and thus does not much affect the extraction efficiency. However, in order to also reduce color difference along the azimuthal direction, a period pattern which generates multiple diffracted light beams is preferable, and preferably a triangular lattice that generates six diffracted light beams is used.

Figure 11:
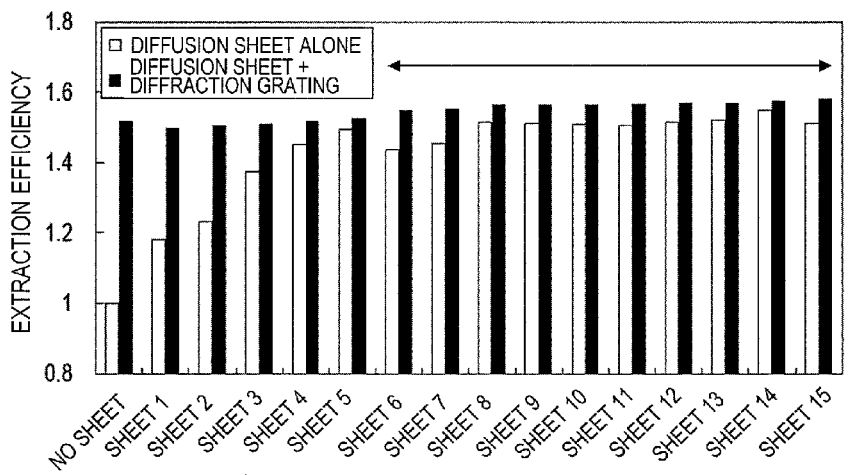
FIG. 11 A graph showing extraction efficiencies when using diffusion layers of various hazes and transmittances according to the first embodiment.
Figure 12:
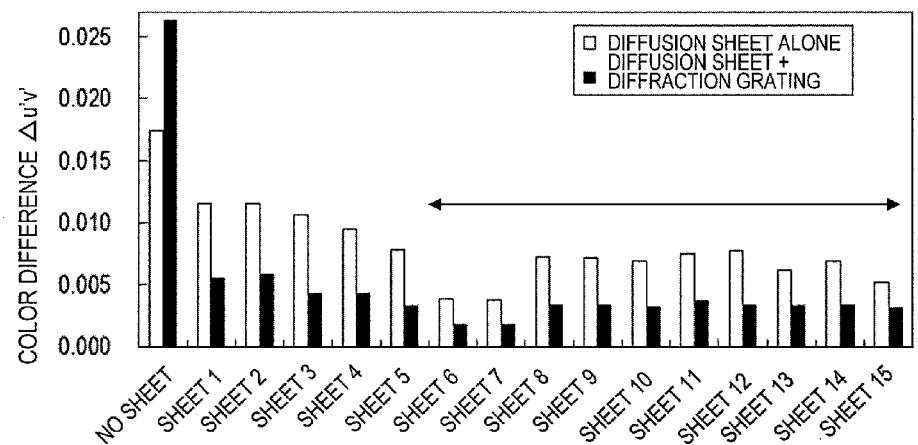
FIG. 12 A graph showing color differences when using diffusion layers of various hazes and transmittances according to the first embodiment.

FIG. 11 and FIG. 12 show values of extraction efficiency and color difference Δu'v' when using diffusion layers 72 of various hazes and transmittances.

In each figure, the data at the left end indicates measurement results obtained with a structure which includes neither the diffusion layer 72 nor the diffraction grating structure 71 and with a structure which does not include the diffusion layer 72 but only includes the diffraction grating structure 71. The diffraction grating has a period of 1.2 μm and a height of 1.0 μm, and the refractive index difference in the diffraction grating is 0.32 (1.46 versus 1.78).

As shown in FIG. 11 and FIG. 12, in all sheets, the extraction efficiency and color difference are improved over those of the structures not including the diffraction grating structure 71. Furthermore, in sheet 6 to sheet 15, the extraction efficiency and color difference are greatly improved over those of the structures not including the diffusion layer 72. These sheets have haze values equal to or greater than 80%, as shown in FIG. 6. This indicates that it is preferable that the diffusion layer 72 has a large haze for the sake of extraction efficiency improvement and color difference reduction. On the other hand, the present construction featuring sheets 1 to 5, whose total light transmittance values are higher than those of sheets 6 to 15, provides smaller effects of extraction efficiency improvement and color difference reduction than with sheets 6 to 15. In particular, although sheet 5 has a haze exceeding 80%, the present construction featuring sheet 5 has an extraction efficiency which is almost equal to the structure not including the diffusion layer 72, and the color difference is not sufficiently small either. This indicates that what is preferable for extraction efficiency improvement and color difference reduction is not only that the haze value is equal to or greater than 80%, but also that the total light transmittance is relatively small.

As a result of studying the diffused light from a light-emitting device having sheet 5 in detail, it was found that its spread angle is smaller than those of the other sheets. In other words, it is important that the diffusion layer 72 used in the present embodiment has a high haze and a large spread angle of diffusion. A sheet having a large spread angle of diffusion induces an increased reflection component via diffusion, and thus inevitably results in a lower total light transmittance. Thus, contrary to common knowledge, it is considered preferable that total light transmittance is not large. From the above results, the diffusion layer 72 preferably has a haze of 80% or more and a total light transmittance of 80% or less. It will be appreciated that the aforementioned effect is not attained when the total light transmittance is low because of the sheet being made of an absorbent material.

Figure 13:
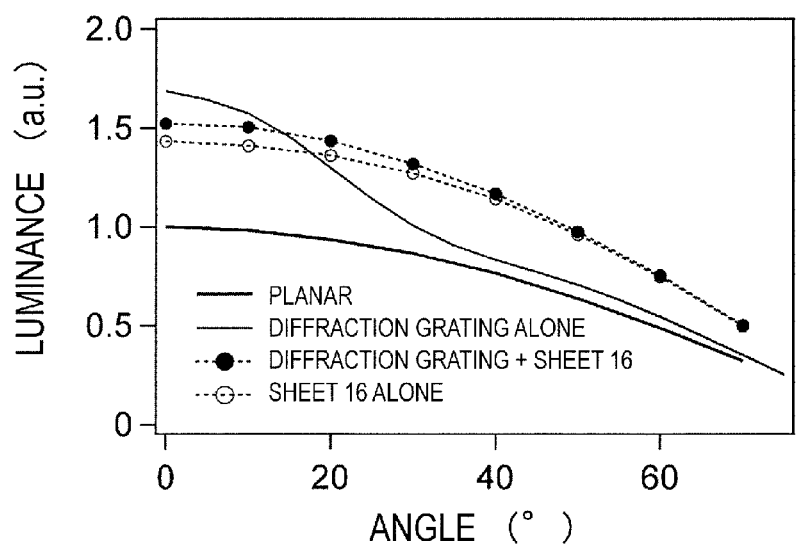
FIG. 13 A graph showing angle dependence of luminance according to the first embodiment.
Figure 14:
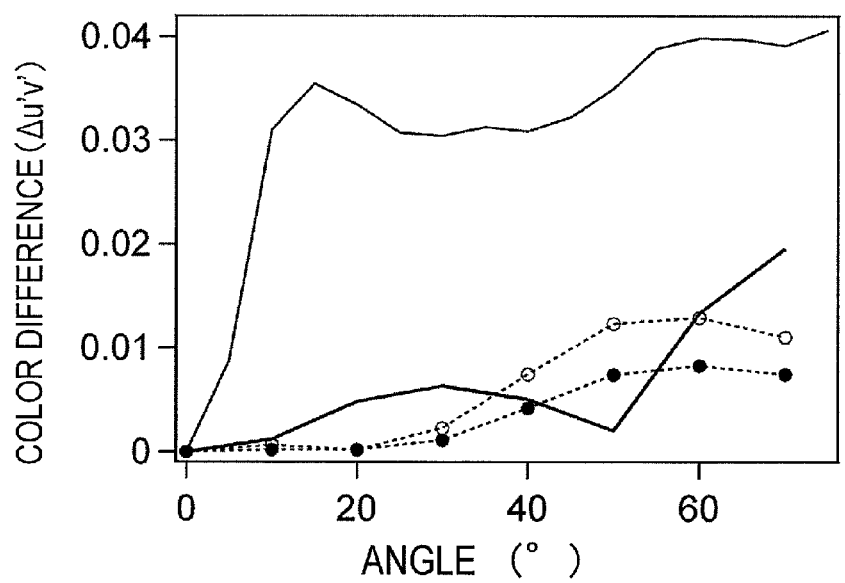
FIG. 14 A graph showing angle dependence of color difference according to the first embodiment.

FIG. 13 and FIG. 14 show luminance and angle dependence of color difference. It can be seen from FIG. 13 and FIG. 14 that the light-emitting device of the present embodiment has a high luminance and small color difference irrespective of the angle at which it is viewed. Furthermore, the changes in light extraction efficiency and color difference relative to angle are smooth, indicative of effective suppression of luminance unevenness and color unevenness.

Thus, since the light-emitting device of the present embodiment includes a diffraction grating structure and a diffusion layer, light extraction efficiency is improved and luminance unevenness and color unevenness can be effectively reduced.

Second Embodiment

Figure 15:
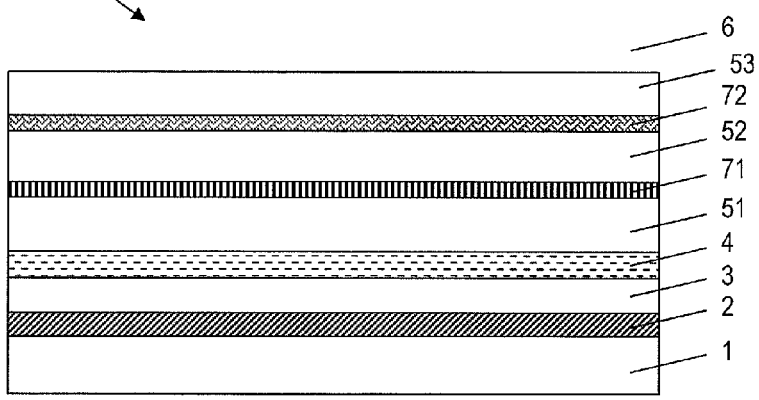
FIG. 15 A diagram schematically showing a cross-sectional structure of a light-emitting device according to a second embodiment.

FIG. 15 schematically shows a cross-sectional structure of a second embodiment of the light-emitting device according the present invention. The light-emitting device 103 differs from the first embodiment in that a layer 53 which is located on the diffusion layer 72 is further included, the layer 53 being an air layer 6. The layer 53 is a protection layer for protecting the diffusion layer 72 from the exterior, for example.

When the diffusion layer 72 has its light-diffusing structure inside the diffusion layer 72, it is effectively as though the layer 53 also existed.

Therefore, even when the layer 53 is further included, this is essentially regardable as a diffusion layer in which the diffusion layer 72 and the layer 53 are integrated. The light-emitting device of the present embodiment provides similar effects to those of the first embodiment, although light may possibly be absorbed in the layer 53, causing a loss on the order of a few %.

Third Embodiment

Figure 16:
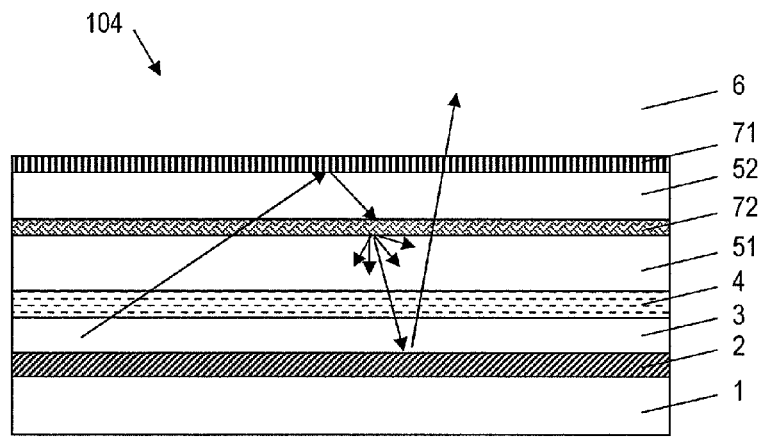
FIG. 16 A diagram schematically showing a cross-sectional structure of a light-emitting device according to a third embodiment.

FIG. 16 schematically shows a cross-sectional structure of a third embodiment of the light-emitting device according to the present invention. The light-emitting device 104 differs from the first embodiment in that the diffraction grating structure 71 and the diffusion layer 72 are switched in position, and that the electrode 2 is reflective.

Since the diffraction grating structure 71 and the diffusion layer 72 are switched in position, the diffusion layer 72 is located between the diffraction grating structure and the emission layer 3 in the present embodiment. Moreover, the electrode 2 has a structure that reflects light going out from the emission layer 3.

Therefore, with the light-emitting device 104, light which is reflected by the diffraction grating structure 71 and the diffusion layer 72 toward the emission layer 3 side is again reflected toward the diffusion layer 72 by the electrode 2, and allowed to go out to the exterior. In this case, the light which is reflected by the diffraction grating structure 71 is transmitted through the diffusion layer 72 twice, whereby inequality of intensity distribution is further alleviated. Therefore, a light-emitting device is realized in which intensity unevenness and color unevenness are better suppressed than in the first embodiment.

Fourth Embodiment

Figure 17:
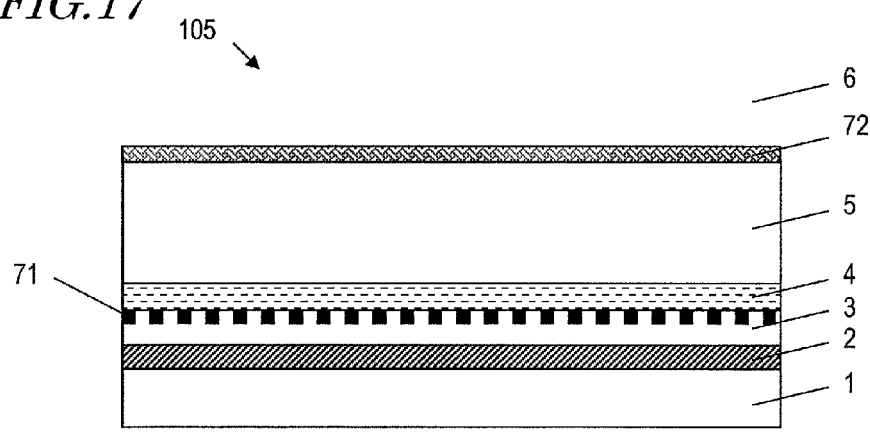
FIG. 17 A diagram schematically showing a cross-sectional structure of a light-emitting device according to a fourth embodiment.

FIG. 17 schematically shows a cross-sectional structure of a fourth embodiment of the light-emitting device according to the present invention. The light-emitting device 105 differs from the first embodiment in that the diffraction grating structure 71 is provided at an interface between the emission layer 3 and the electrode 4.

As described above, the diffraction grating structure 72 has a structure to which a periodic optical path-length difference is imparted, and therefore can be formed at the interface of the emission layer 3 with the electrode 4, or at the interface of the electrode 4 with the emission layer 3. More specifically, the diffraction grating structure 72 may be formed by periodically etching the surface of the emission layer 3 or the surface of the electrode 4, and embedding a substance which has a different refractive index from that of the emission layer 3 or the electrode 4. Alternatively, it is possible to form the emission layer 3 or 4 in a periodic pattern by using a mask, e.g., anodic porous alumina, having a minute pattern.

With such a structure, it is not necessary to separately provide a layer having the diffraction grating structure 72. Thus, light absorption associated with any such layer can be suppressed, or the overall thickness of the light-emitting device can be reduced.

Fifth Embodiment

Figure 18:
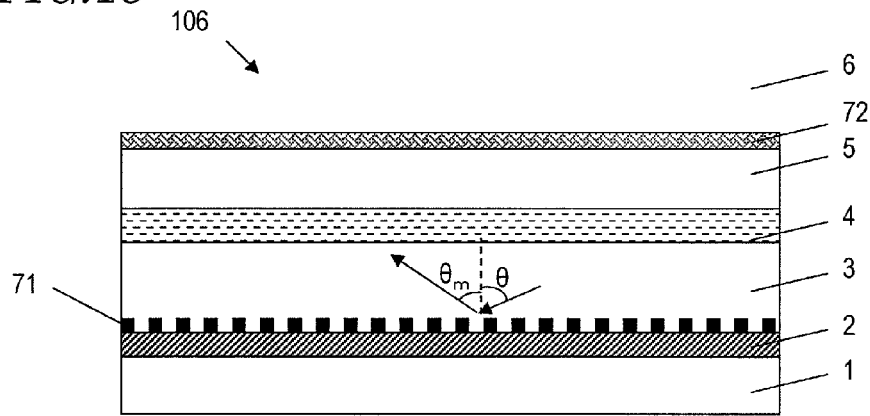
FIG. 18 A diagram schematically showing a cross-sectional structure of a light-emitting device according to a fifth embodiment.

FIG. 18 schematically shows a cross-sectional structure of a fifth embodiment of the light-emitting device according to the present invention. The light-emitting device 106 differs from the first embodiment in that the diffraction grating structure 71 is provided at an interface between the emission layer 3 and the electrode 2.

In this case, there is an effect of diffracting, within the light which is generated in the emission layer 3, any light which travels in the direction of the electrode 2. The light which is incident at an angle θ on the diffraction grating structure 71 formed on the electrode 2 is diffracted in the $\theta_m$ direction. This condition can be expressed by eq. (3) below.

$$n_3(\sin\theta_m - \sin\theta) = m\lambda/p \quad (3)$$

This is the same as eq. (2), and provides effects similar to those of the first to fourth embodiments above. Moreover, since light which is reflected by the layers which are above the emission layer 3 is again diffracted so as to go out to the exterior, effective light extraction is enabled.

Without being limited to the above embodiments, the present invention admits various modifications. For example, although there is one each of the diffraction grating structure 71 and the diffusion layer 72 in the first to fifth embodiments, the light-emitting device may include two or more of them. In the case where two or more diffraction grating structures 71 are included, a diffraction grating may also be constructed in the direction of layering, so that a three-dimensional diffraction grating structure is realized as a whole. Also, the first to fifth embodiments may be combined.

Furthermore, the vertical cross-sectional shapes of the diffraction grating structure and the diffusion layer are not limited to rectangular shapes, and may be trapezoidal or conical shapes, possibly with curved slopes. In fact, when working a micron-order structure via cutting or a semiconductor process, etc., slopes or curves will form at the corner portions. Unless the properties of the diffraction grating and the random structure as described in the above embodiments are lost owing to these factors, such shapes are encompassed by the embodiments of the present invention.

Although the above embodiments illustrate the present invention as light-emitting devices, it will be apparent from the above description that the structure according to the present invention is applicable to various surface emission devices, and the present invention may be implemented as an optical sheet which is capable of combination with various surface emission devices.

INDUSTRIAL APPLICABILITY

The light-emitting device and optical sheet disclosed herein are suitably used for various light-emitting devices, and suitably used for surface emission devices, e.g., organic EL devices.

REFERENCE SIGNS LIST 1 substrate
2 electrode
3 emission layer
4 electrode
6 air layer
51, 52, 53 layer
71 diffraction grating structure
72 diffusion layer

The invention claimed is:

1. A light-emitting device comprising: an emission layer; a diffraction grating structure including a diffraction grating; and a diffusion layer having a structure for diffusing light which is transmitted from one face to another face, wherein
light going out from the emission layer has a central wavelength λ;
the diffraction grating has a period p which is not less than 1.0λ and not more than 3.5λ;
the diffusion layer has a haze of 80% or more and a total light transmittance of 80% or less; and
a maximum amount of change Δu'v' of (u'v') of the CIE colorimetric system with respect to an angle of viewing is 0.005 or less.

2. The light-emitting device of claim 1, wherein the diffraction grating structure is located between the diffusion layer and the emission layer.

3. The light-emitting device of claim 2, wherein the diffusion layer is in contact with air.

4. The light-emitting device of claim 2, further comprising a protection layer, wherein the diffusion layer is located between the protection layer and the diffraction grating structure, and the protection layer is in contact with air.

5. The light-emitting device of claim 2, further comprising first and second electrodes which are in contact with the emission layer and sandwich the emission layer, wherein,
the first electrode is interposed between the diffusion layer and the emission layer, and transparent with respect to light going out from the emission layer; and
the diffraction grating structure is provided at an interface of the emission layer which is in contact with the first electrode.

6. The light-emitting device of claim 1, wherein the diffusion layer is located between the diffraction grating structure and the emission layer.

7. The light-emitting device of claim 6, further comprising first and second electrodes which are in contact with the emission layer and sandwich the emission layer, wherein,
the first electrode is interposed between the diffusion layer and the emission layer, and transparent with respect to light going out from the emission layer; and
the second electrode reflects light going out from the emission layer.

8. The light-emitting device of claim 1, wherein the emission layer is located between the diffusion layer and the diffraction grating structure.

9. The light-emitting device of claim 8, further comprising first and second electrodes which are in contact with the emission layer and sandwich the emission layer, wherein,
the first electrode is interposed between the diffusion layer and the emission layer, and transparent with respect to light going out from the emission layer; and
the diffraction grating structure is provided at an interface of the emission layer which is in contact with the second electrode.

10. A sheet to be disposed adjacent to a light-emitting device having an emission layer, the sheet comprising: a diffraction grating structure including a diffraction grating; and a diffusion layer having a structure for diffusing light which is transmitted from one face to another face, wherein
light going out from the emission layer has a central wavelength $\lambda$;
the diffraction grating has a period p which is not less than $1.0\lambda$ and not more than $3.5\lambda$;
the diffusion layer has a haze of 80% or more and a total light transmittance of 80% or less; and
a maximum amount of change $\Delta u'v'$ of (u'v') of the CIE colorimetric system with respect to an angle of viewing is 0.005 or less.

* * * * *